United States Patent [19]

Fratti

[11] Patent Number: 5,565,823
[45] Date of Patent: Oct. 15, 1996

[54] VOLTAGE CONTROLLED ATTENUATOR USING PN DIODES

[75] Inventor: Roger A. Fratti, Cumru Township, Pa.

[73] Assignee: Lucent Technologies Inc., Murray Hill, N.J.

[21] Appl. No.: 360,892

[22] Filed: Dec. 21, 1994

[51] Int. Cl.[6] ..................................................... H01P 1/22
[52] U.S. Cl. ........................ 333/81 R; 333/81 A; 327/308
[58] Field of Search ................................... 327/503, 504, 327/308; 333/81 R, 81 A, 103, 104; 257/656

[56] References Cited

U.S. PATENT DOCUMENTS

| | | | |
|---|---|---|---|
| 4,019,160 | 4/1977 | Kam | 333/81 R |
| 4,654,610 | 3/1987 | Dasilva | 333/81 R |
| 5,126,703 | 6/1992 | Kosuga | 333/81 R |
| 5,140,200 | 8/1992 | Stanton | 307/540 |
| 5,204,643 | 4/1993 | Verronen | 333/81 R |
| 5,262,741 | 11/1993 | Kitakubo | 333/81 R |
| 5,270,824 | 12/1993 | Dobrovolny | 358/191.1 |

Primary Examiner—Benny Lee
Assistant Examiner—David Vu

[57] ABSTRACT

A fully integrator RF attenuator performs gain control upon a received RF signal without the use of an off-silicon PIN diode. The attenuator includes a T-configuration pad in conjunction with a current source. A direct current signal biases a shunt element in the T-pad. Preferably, a voltage control signal which controls the direct current is generated as a negative feedback signal in proportion to the magnitude of the RF detected at the attenuator output.

10 Claims, 6 Drawing Sheets

VOLTAGE CONTROLLED ATTENUATOR USING PN DIODES

FIELD OF THE INVENTION

The present invention relates to a wholly integrated analog voltage controlled attenuator.

DESCRIPTION OF THE RELATED ART

Radio-frequency (RF) signal attenuators are typically used in cable television (CATV) and video applications. RF attenuators, therefore, must operate over a broad bandwidth, e.g., from below 1 megahertz to the gigahertz range, and display accuracy to fractions of a dB. An RF attenuator may or may not include the use of automatic gain control to control RF signal attenuation. With automatic gain control, the RF signal output from the attenuator is consistently maintained at a particular amplitude regardless of the signal's input amplitude, e.g., to prevent saturation from over-large signals. RF attenuators typically employ one or several T-attenuator or Pi-attenuator sections, and include electronic switching elements to select or bypass the attenuator sections. PIN diodes are frequently used to provide the switching. PIN diodes display low capacitance in the off state and are therefore ideal for high-speed switching; e.g., U.S. Pat. No. 4,359,699, issued Nov. 16, 1992.

T-pad or π attenuator sections typically include a variable resistance to shunt over-large portions of a received RF signal to ground. PIN diodes, while used as high-speed switching elements, are also used to provide such variable resistance. The resistance of a PIN diode varies in proportion to an amount of biasing current flowing through it. Examples of PIN-diode-based attenuators are disclosed in the following patents: U.S. Pat. No. 5,270,824, issued Dec. 14, 1993, U.S. Pat. No. 5,204,643, issued Apr. 20, 1993, U.S. Pat. No. 5,126,703, issued Jun. 30, 1992, U.S. Pat. No. 4,654,610, issued Mar. 31, 1987, and U.S. Pat. No. 5,140,200, issued Aug. 18, 1992, PIN-diode-based attenuators, however, although widely used, are not without problems. For example, the central frequency of PIN diode characteristics changes with the PIN diode's changing resistance. In addition, PIN diodes display nonlinear attenuation as a function of tuning voltage characteristics, requiring complex circuitry for nonlinearity adjustment. Further, PIN diodes are not readily incorporated into existing silicon technologies, in particular, integrated analog voltage controlled attenuators, not only because of routing and space allocation complications, but because substrate resistivities are not high enough to be useful as an intrinsic layer when formed in an ion-implant Si process. In addition, diffusions from the implants and subsequent annealing during the Si fabrication process would not allow formation of a well-controlled intrinsic region even if the substrate resistivities were high enough.

SUMMARY OF THE INVENTION

A conventional approach for providing RF signal attenuation for CATV and video applications includes varying the resistance of a PIN-diode to shunt away various amounts of the received RF signal. PIN diodes, however, cannot be integrated into existing silicon technologies. A fully integrated RF voltage controlled attenuator is provided by the present invention which operates without the need for off-silicon PIN diodes. The RF attenuator displays linear attenuation characteristics with a linearly applied tuning voltage over a broad bandwidth. To do so, a pn junction diode is provided as part of an integrated circuit to control an amplitude of the circuit's RF output.

In a preferred embodiment, the amplitude of the attenuator output signal is constantly and accurately maintained at a specified level by use of automatic gain control implemented within the RF attenuator. The analog or RF automatic gain control maintains signal gain by adjusting the variable resistance of a T-pad attenuator shunt element. The signal attenuation varies with the varying resistance of the shunt element, which follows the magnitude of a DC signal, $I_{DC}$, provided to it as bias. The RF shunt element is preferably a pn junction diode and therefore integrable within the attenuator by existing silicon technology. $I_{DC}$ is generated in direct proportion to the amplitude of a voltage control signal, $V_{DC}$, the control signal fed back from the RF output. $V_{DC}$ is directly proportional to the amplitude of the RF output signal. The need to implement the shunt element as a conventional off-silicon PIN diode is obviated by use of the integrated pn junction diode.

DETAILED DESCRIPTION OF THE INVENTION

Automatic gain control circuits are conventionally used in the front end of receivers to compensate for variations in the level of various received signals. Within a receiver, the automatic gain control circuit detects an amplitude of a received, IF signal. A DC voltage signal is generated thereat in proportion to the amplitude of the IF signal. The DC voltage signal is fed back to the input stage of the front end to provide a gain to (adjust or attenuate) the received IF signal. More specifically, the DC voltage signal is utilized to generate a current to bias, for example, a PIN diode. The PIN diode would be connected from the front end stage to ground to drain off some portion of the received RF signal if the signal were over-large.

Figure 1:
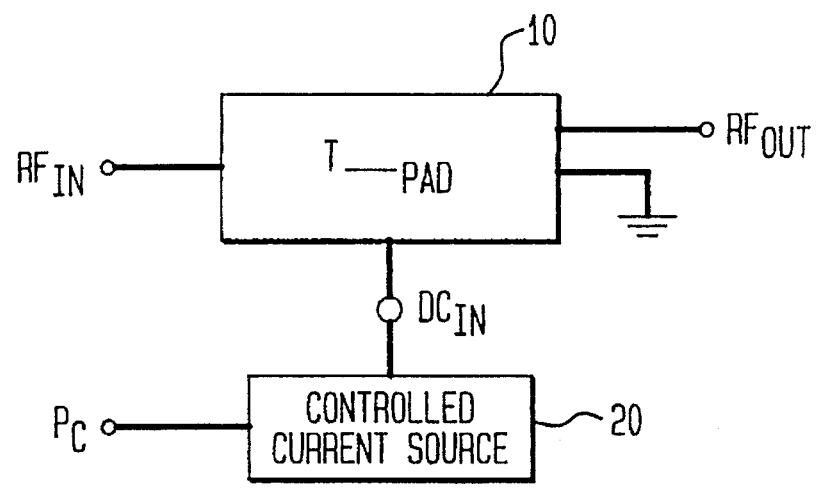
FIG. 1 is a schematic block diagram of an RF signal attenuator of this invention.

A schematic block diagram of an RF attenuator of this invention is shown in FIG. 1. The invention shown therein includes an RF T-pad section 10 electrically connected to a controlled current source 20. RF T-pad section 10 includes a port $RF_{IN}$ for receiving analog or RF signals, and a port $RF_{OUT}$ for outputting a gain-adjusted version of the received signal. Analog or RF signals are received at the RF T-pad and attenuated within the RF T-pad, if necessary, to prevent saturation of receiver circuitry to which port $RF_{OUT}$ is connected. To do so, part of the over-large, received RF signal power is shunted away in accordance with a control current signal $I_{DC}$.

The pad or shunt element within the T-pad includes a pn junction diode $D_1$ such that the attenuator may be fully integrated. The current control signal $I_{DC}$ is generated within a controlled current source in proportion to a voltage control signal, $V_{DC}$, provided to the source's input port, $P_C$. $I_{DC}$ controls the attenuation provided by the T-pad section. $I_{DC}$, i.e., the amount of attenuation may be provided within the present invention, by use of automatic gain control (to be discussed in greater detail with reference to the preferred embodiment) which adjusts the attenuation level in accordance with the magnitude of the RF output signal.

Figure 2:
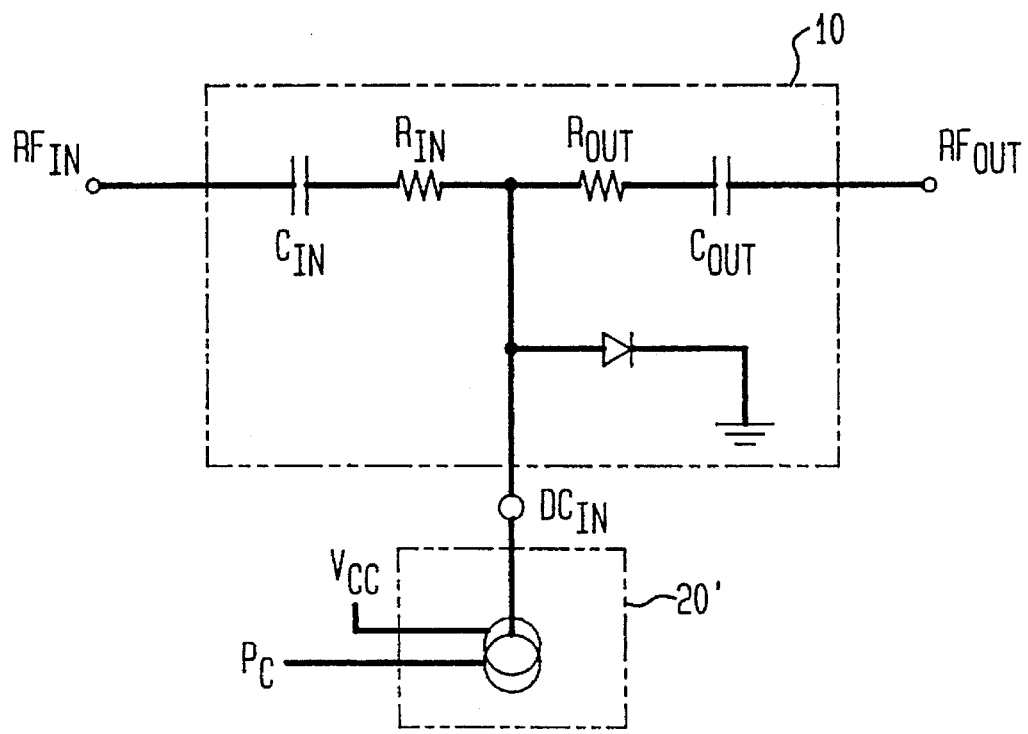
FIG. 2 is a schematic circuit diagram of the attenuator depicted in FIG. 1.

FIG. 2 is a detailed version of the attenuator depicted in FIG. 1. In FIG. 2, the controlled current source 20 of FIG. 1 is replaced by a voltage-controlled current source 20'. The voltage-controlled source 20' is electrically connected to a voltage control port, $P_c$, a power source, $V_{cc}$, and to DC input port, $DC_{in}$, of RF T-pad section 10.

RF T-Pad section 10 includes an RF input port, $RF_{in}$, connected through a first DC blocking capacitor, $C_{in}$, and a first resistor, $R_{in}$, to an anode end of an RF shunt element, junction diode $D_1$. The anode end of junction diode $D_1$ is also electrically connected to a second resistor, $R_{OUT}$, a second DC blocking capacitor, $C_{OUT}$ and an RF output port, $RF_{OUT}$. Cathode end of diode $D_1$ is connected to ground. The first resistor, $R_{in}$, and second resistor, $R_{out}$, are either fixed or variable resistors to aid in adjusting the junction's resistance.

The current, $I_{DC}$, flowing through the shunt element, junction diode $D_1$, defines the junction's resistance. $I_{DCIN}$ flows into the T-pad 10 through $DC_{IN}$ to the anode end of junction diode $D_1$. $I_{DC}$ controlled by adjusting the magnitude of the voltage control signal, $V_{DC}$, provided to voltage control port, $P_C$. The DC blocking capacitors prevent $I_{DC}$ from flowing towards the RF input and output, such that substantially all of $I_{DC}$ is directed through pn junction diode $D_1$. The junction diode's resistance is adjusted thereby.

As mentioned above, $V_{DC}$, is preferably generated in proportion to the amplitude of the RF signal detected at the RF output port, essentially forming a feedback loop for automatic gain control. The invention, however, is not limited to an attenuator requiring automatic gain control for adjusting the amplitude of the RF output signal. Varying $V_{DC}$ varies $I_{DC}$, all that is needed to control the amplitude of the RF output signal. $V_{DC}$ may be generated and provided to the voltage control port $P_c$ by an means known to those skilled in the art.

Figure 3A:
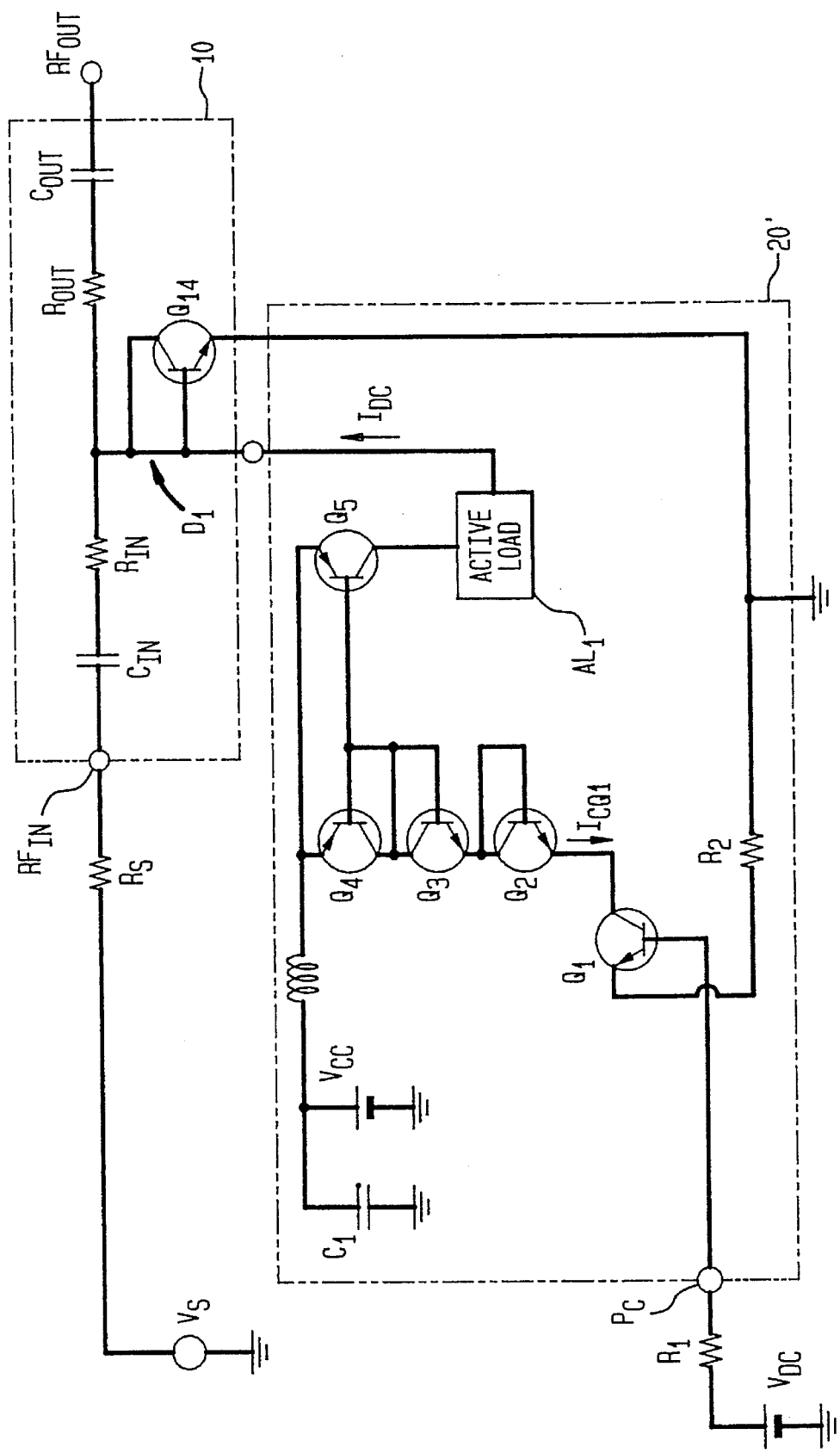
FIG. 3A is detailed schematic diagram the attenuator depicted in FIG. 2.

FIG. 3A is a detailed schematic circuit diagram of the RF attenuator circuit of FIG. 2, which is easily implemented as an all-silicon integrated design. Voltage-controlled current source 20' generates the attenuation control signal, $I_{DC}$, as follows. A voltage control signal $V_{DC}$ is provided to voltage control port $P_C$. $V_{DC}$ across a resistor $R_1$ generates a biasing current which flows into a base of an NPN transistor $Q_1$. The current generated in a collector of $Q_1$ in response to the base current essentially defines $I_{DC}$. An emitter of transistor $Q_1$ is connected through a resistor $R_2$ to AC ground to sink $I_{CQ1}$. The collector current, $I_{CQ1}$, flows from an emitter of a diode-connected NPN transistor $Q_2$. The current flows into collector of $Q_2$ from the emitter of NPN diode-connected transistor $Q_3$. Both transistors $Q_2$ and $Q_3$ are diode-connected. Shorting the base and collector of a BJT transistor, i.e., an NPN such as transistors $Q_2$ and $Q_3$, results in a two-terminal device displaying i–v characteristics identical to the $i_E$–$V_{BE}$ of the transistor. Because BJT transistors connected as such remain in active mode ($V_{CB}$=0 provides for active mode operation), the current drawn into the collector and base are split in accordance with the transistors $\beta$.

Collector and base of transistor $Q_3$ are connected to both the collector and base of PNP transistor $Q_4$, as well as the base of PNP transistor $Q_5$. Transistors $Q_4$ and $Q_5$ form a current mirror. Accordingly, the current flowing through transistor $Q_4$ (proportional to the control voltage signal $V_{DC}$), is mirrored in transistor $Q_5$ and defines $I_{DC}$. Transistors $Q_4$ and $Q_5$ are matched transistors, and $Q_4$ is diode connected. As long as transistor $Q_5$ remains active, the current through the collector of $Q_5$ will always equal the current through $Q_4$, independent of $V_{cc}$. The emitters of transistors $Q_4$ and $Q_5$ are also electrically connected through a RF choke $L_1$ to $V_{CC}$, and also through a bypass capacitor $C_3$ to ground.

The bias current, $I_{DC}$, flows from the collector of transistor $Q_5$ into an active load, AL1, formed by an array of diode-connected transistors $Q_6$–$Q_{13}$. The emitter of transistor $Q_{13}$, the last transistor within the array, is connected to diode $D_1$. Diode $D_1$ is the base-emitter junction of diode-connected transistor $Q_{14}$. Accordingly, $I_{DC}$ biases diode $D_1$ in accordance with $V_{DC}$.

Figure 3B:
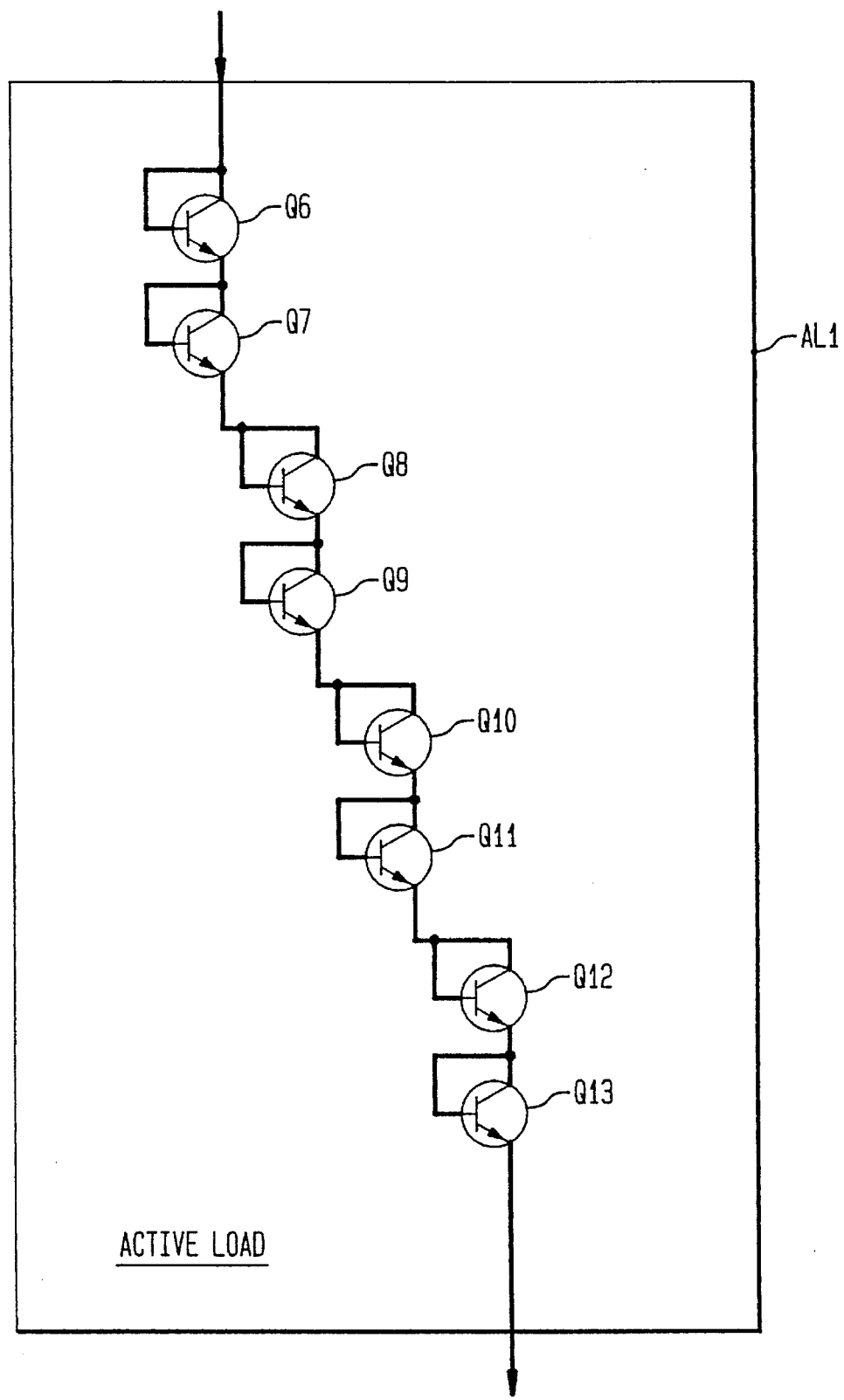
FIG. 3B is an enlarged view of a portion of the schematic of FIG. 3A.

A more detailed view of active load AL1 is presented in FIG. 3B. The biasing current flows into the active load via the collector and base (diode-connected) of NPN transistor $Q_6$. The emitter of transistor $Q_6$ is connected to diode-connected NPN transistor $Q_7$. The emitter of transistor $Q_7$ is electrically connected to diode-connected transistor $Q_8$, which is in turn connected at its emitter to diode-connected transistor $Q_9$, and so on through transistor $Q_{13}$, i.e., $Q_9$–$Q_{13}$. $I_{DC}$ flows from the emitter of $Q_{13}$ into diode $D_1$.

The effect of $I_{DC}$ on diode $D_1$, and, therefore, the T-pad 10 will now be discussed. RF signals received at $RF_{IN}$, pass through capacitor $C_{IN}$ and $R_{IN}$ to the anode of diode $D_1$. At that point in the circuit, the RF is riding on the DC bias, and splits between the RF output path and diode $D_1$ to ground. $I_{DC}$ flowing through $D_1$ varies the diode resistance and therefore the amount of the received RF signal routed to ground. The remainder of the RF signal passes through $R_{OUT}$ and $C_{OUT}$ to an AC load (i.e., via $RF_{OUT}$). The voltage control signal $V_{DC}$ provided to control port $P_c$ is preferably generated in proportion to the amplitude of the RF output signal present at $RF_{OUT}$.

The variable attenuation provided by the pn junction of diode-connected transistor $Q_{14}$, is, ignoring mismatch loss terms, $$k = Z_O R_{PN} + ((Z_O)^2/(R_{PN})^2 + 1)^{1/2}$$

where $Z_O$=50 ohms and $R_{PN}$ is the resistance of the shunt element, diode $D_1$. For control voltage $V_{DC}$ across the BE junction of transistor $Q_1$ through resistor $R_1$ (when $V_{DC}$ is above the knee of the junction), the current $I_{CQ1}$ flowing through the collector of $Q_1$ (the effective $D_1$ control current, $I_{DC}$) is $$(V_{DC} - 0.7)/R_2,$$

which is the control current for a linear portion of the tuning range. The diode resistance of the BE junction of transistor $Q_{14}$ (diode $D_1$) is $$V_T/I_{DC},$$

when the applied voltage is greater than approximately 0.7 volts and where $V_T = (26 \times 10^{-3})$ volts. The attenuation of the shunt element, $D_1$, is therefore $$Z_O I_{DC}/V_T + [Z_O^2 (I_{DC})^2/V_T^2 + 1]^{1/2}.$$

The equivalent resistance for a conventional PIN junction is:

$V_T/(I_{DC})^{0.87}$.

The attenuation of the conventional PIN diode is $Z_O(I_{DC})^{0.87}/V_T+[Z_O^2 (I_{DC})^{1.74}/V_T^2+1]^{1/2}$.

As can be inferred from the comparing the pn junction diode and PIN diode equations, the resistance of the PIN diode not only increases non-linearly, but increases less than the resistance of $D_1$.

Figure 4:
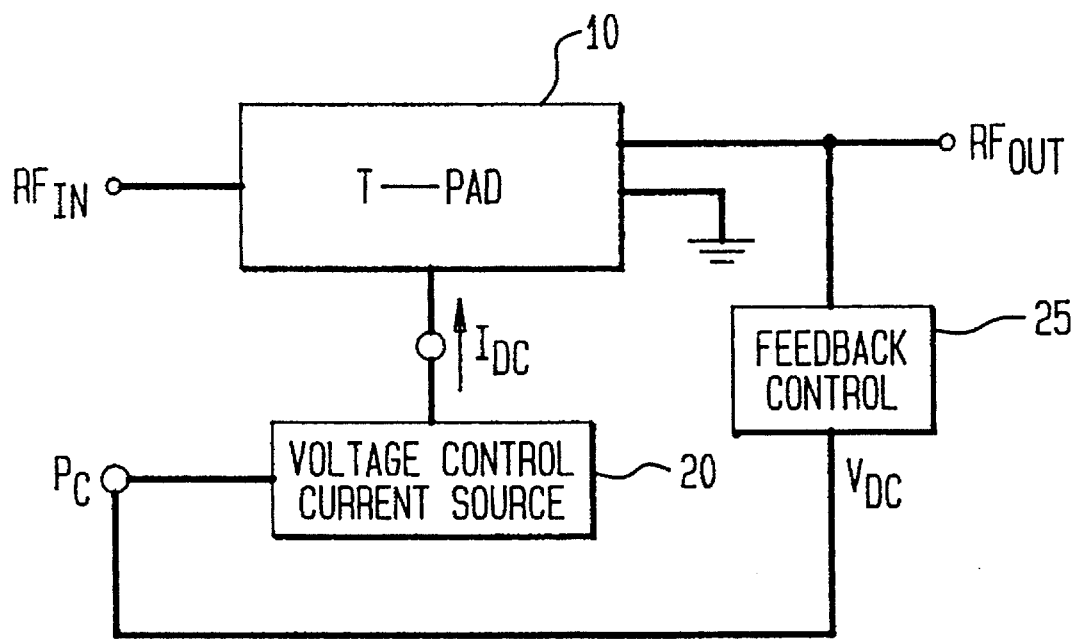
FIG. 4 is a schematic block diagram of the preferred embodiment of the RF attenuator of this invention.

A functional block diagram of the preferred embodiment of an RF attenuator of this invention is shown in FIG. 4. The RF attenuator includes a feedback loop connected from the RF output port, $RF_{OUT}$, through a feedback control circuit portion 25, to the voltage control port $P_C$. Feedback control portion 25 generates $V_{DC}$ in proportion to the magnitude of the RF output signal detected at $RF_{OUT}$. Accordingly, the control current, $I_{DC}$, provided by voltage controlled current source 20' in accordance with $V_{DC}$ is directly proportional to the height of the RF output. If the signal at $RF_{OUT}$ gets too large, the gain of the received RF signal is reduced, and vice-versa.

Figure 5:
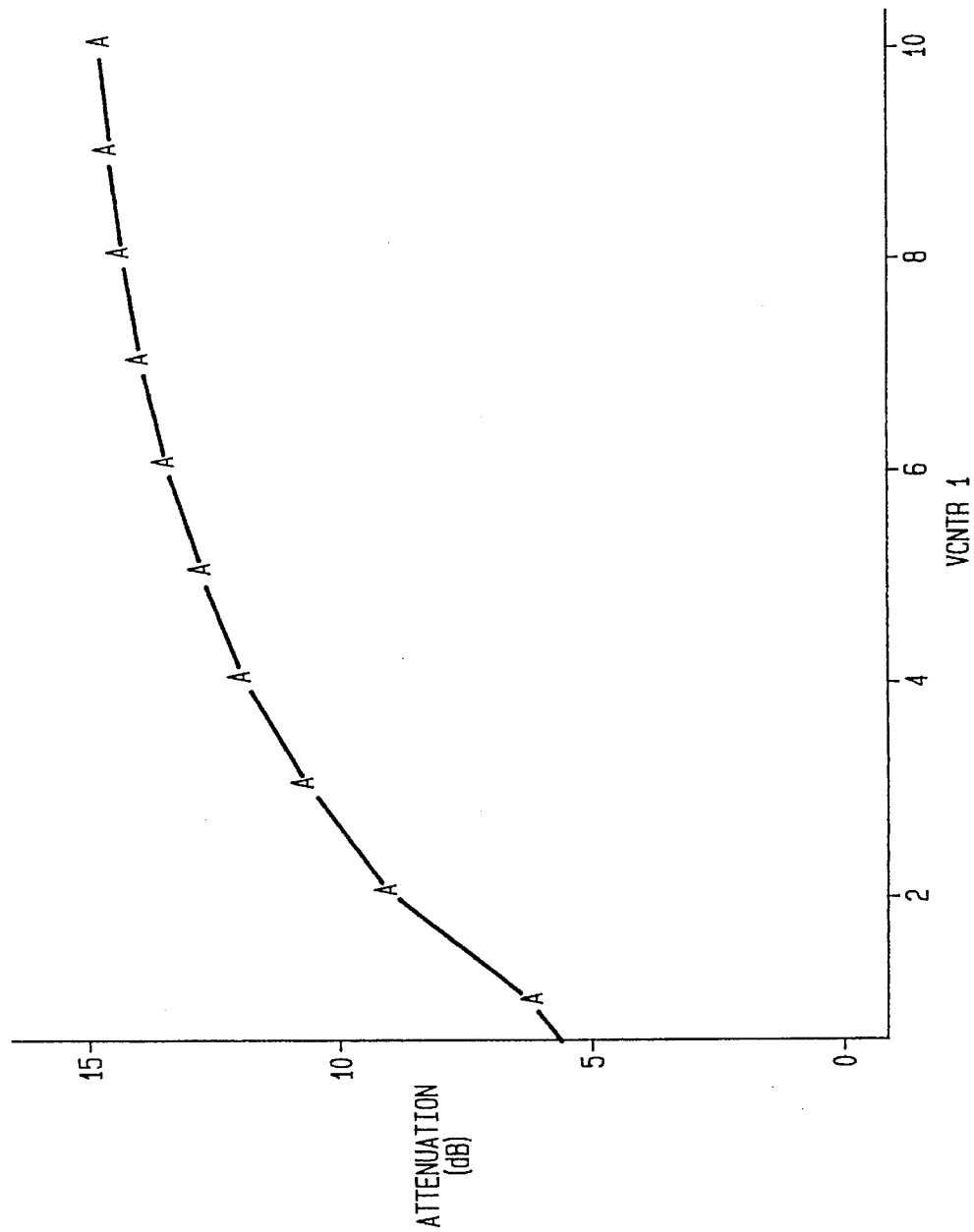
FIG. 5 is a plot of attenuation versus control voltage for the preferred embodiment of this invention.

FIG. 5 is a comparison plot of attenuation in dB versus control voltage, $V_{DC}$, for the attenuator of this invention, i.e., formed with a pn junction diode $D_1$, and a conventional PIN diode-based attenuator. As is clearly seen in the figures, the plot of pn junction diode attenuation per $V_T$ is more linear than that for the PIN diode. The plot is derived from testing the fully integrated silicon attenuator at 800 MHZ.

Figure 6:
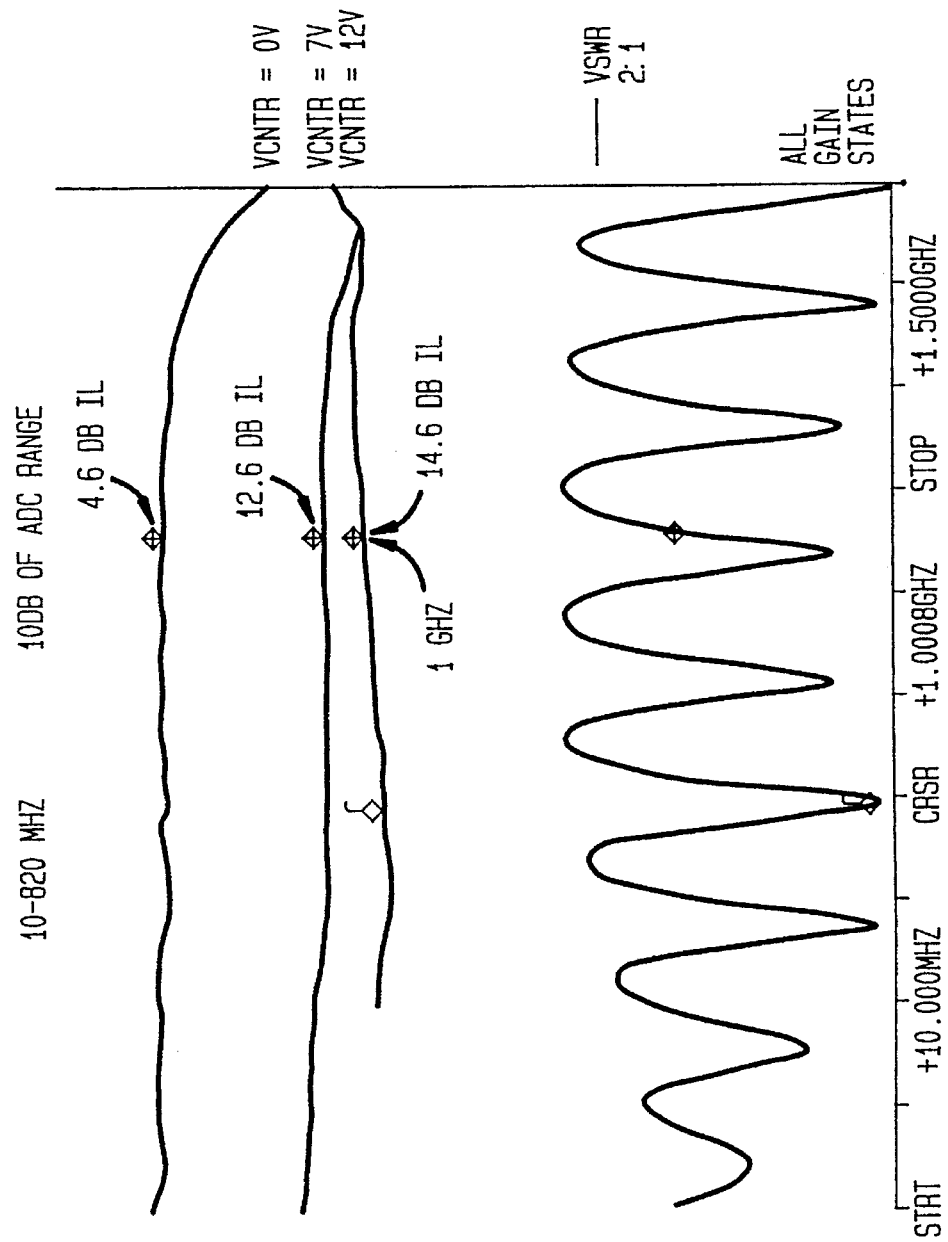
FIG. 6 is a plot of attenuation versus frequency for the preferred embodiment of this invention.

FIG. 6 is a plot of swept frequency insertion loss and return loss for the RF attenuator of this invention from 10 MHz to 1500 MHz for various control voltages $V_{DC}$. The gain provided to the received signal at $RF_{IN}$ is substantially linear over the entire bandwidth. According to FIGS. 5 and 6, the use of a pn junction diode in lieu of a PIN diode provides an attenuator that provides more effective and linear attenuation.

While the above embodiment has been described with particular transistors and limitations corresponding to the circuitry therewith, it is included for illustration purposes only and is not meant to limit the scope of this invention. The invention is to be limited only as defined by the claims. More particularly, while the RF attenuator provided hereby was described as including a voltage-to-current converter to provide shunt element biasing, the invention is not limited to structure according thereto. Any means known to those skilled in the art for providing current biasing to the shunt element within the T-pad to control RF attenuation may be used without departing from the scope and spirit of this invention.

What is claimed is:

1. An analog RF signal attenuator for controlling an amplitude of an RF signal based on a voltage control signal providing a voltage-to-current converter including a current mirror and an active load, said active load comprising a plurality of diode-connected transistors, said attenuator wholly integrable within a monolithic integrated circuit and including an RF input port, an RF output port and an RF shunt element, wherein an amount of signal gain is provided substantially linearly to said RF signal with linear variations of said voltage control signal.

2. The analog RF signal attenuator defined by claim 1, wherein said voltage control signal is generated by signal generation means in proportion to a signal amplitude detected at said RF output port.

3. The analog RF signal attenuator defined by claim 1, wherein said shunt element is a pn junction diode.

4. The analog RF signal attenuator defined by claim 3, wherein said attenuation constant is approximately equal to:

$Z_O/R_{pn}+((Z_O/R_{pn})^2+1)^{1/2}$, where $Z_O$ is the system impedance and $R_{pn}$ is the junction resistance of the pn diode.

5. The analog RF attenuator defined by claim 4, wherein $R_{pn}$ equals $V_T/I_{DC}$, $V_T$ equals $26\times10^{-3}$ volts and $I_{DC}$ is the DC signal.

6. The analog RF signal attenuator defined by claim 4, wherein a bandwidth of operation of said attenuator extends from 10 to 1500 MHz.

7. The analog RF signal attenuator defined by claim 1, formed as a T structure.

8. The analog RF signal attenuator defined by claim 1, wherein a bandwidth of said attenuator extends from 40 to 820 MHz and an attenuation performed thereby extends from 0 to 12 dB.

9. The analog RF signal attenuator defined by claim 1, wherein said RF input and RF output ports include DC blocking capacitors.

10. The analog RF signal attenuator defined by claim 1, wherein said RF input and RF output ports include variable resistors.

* * * * *